United States Patent
Fefer et al.

(10) Patent No.: US 8,531,197 B2
(45) Date of Patent: Sep. 10, 2013

(54) INTEGRATED CIRCUIT DIE, AN INTEGRATED CIRCUIT PACKAGE AND A METHOD FOR CONNECTING AN INTEGRATED CIRCUIT DIE TO AN EXTERNAL DEVICE

(75) Inventors: Yefim-Haim Fefer, Petah-Tikva (IL);
Valery Neiman, Rishon Lezion (IL);
Sergey Sofer, Reshon Letzion (IL)

(73) Assignee: Freescale Semiconductor, Inc., Austin, TX (US)

( * ) Notice: Subject to any disclaimer, the term of this patent is extended or adjusted under 35 U.S.C. 154(b) by 390 days.

(21) Appl. No.: 13/054,122

(22) PCT Filed: Jul. 17, 2008

(86) PCT No.: PCT/IB2008/052872
§ 371 (c)(1),
(2), (4) Date: Jan. 14, 2011

(87) PCT Pub. No.: WO2010/007472
PCT Pub. Date: Jan. 21, 2010

(65) Prior Publication Data
US 2011/0121818 A1 May 26, 2011

(51) Int. Cl.
*G01R 31/3187* (2006.01)

(52) U.S. Cl.
USPC ........ 324/750.3; 324/674; 324/681; 324/520; 324/754.19; 324/757.04; 324/762.01; 324/762.02; 714/738; 714/724; 702/117

(58) Field of Classification Search
USPC ............... 324/674, 681, 520, 754.19, 757.04, 324/750.3, 762.01, 762.02; 714/738, 724; 702/117
See application file for complete search history.

(56) References Cited

U.S. PATENT DOCUMENTS

| | | | |
|---|---|---|---|
| 4,646,299 A | 2/1987 | Schinabeck et al. | |
| 5,457,400 A * | 10/1995 | Ahmad et al. | 324/750.3 |
| 5,524,114 A * | 6/1996 | Peng | 714/724 |
| 5,929,650 A * | 7/1999 | Pappert et al. | 324/750.3 |
| 6,199,182 B1 | 3/2001 | Whetsel | |
| 6,389,558 B1 * | 5/2002 | Herrmann et al. | 714/39 |
| 6,408,410 B1 | 6/2002 | Needham | |
| 6,640,323 B2 * | 10/2003 | Akram | 714/724 |
| 6,664,799 B2 * | 12/2003 | Lovett | 324/759.02 |
| 6,801,869 B2 * | 10/2004 | McCord | 702/117 |
| 7,512,915 B2 * | 3/2009 | Anand et al. | 716/136 |
| 7,598,726 B1 * | 10/2009 | Tabatabaei | 324/756.07 |
| 7,701,237 B2 * | 4/2010 | Ohashi et al. | 324/750.05 |
| 7,800,389 B2 * | 9/2010 | Friedrich et al. | 324/750.3 |
| 7,852,094 B2 * | 12/2010 | Chraft et al. | 324/754.07 |
| 7,928,753 B2 * | 4/2011 | Fefer et al. | 324/762.01 |
| 7,932,731 B2 * | 4/2011 | Sofer et al. | 324/613 |
| 7,994,807 B1 * | 8/2011 | Koh et al. | 324/750.3 |
| 8,115,507 B2 * | 2/2012 | Mizuno | 324/762.01 |

(Continued)

OTHER PUBLICATIONS

International Search Report and Written Opinion correlating to PCT/IB2008/052872 dated May 11, 2009.

*Primary Examiner* — Jermele M Hollington
*Assistant Examiner* — Lamarr Brown

(57) ABSTRACT

An integrated circuit die comprises an electronic circuit and one or more output ports for outputting signals from the die via an external impedance, to a load, external from the die. The output port is connected to the electronic circuit. The die is further provided with an on-die sampling oscilloscope circuit connected to the output port, for measuring a waveform of the outputted signals.

20 Claims, 2 Drawing Sheets

(56) References Cited

U.S. PATENT DOCUMENTS

| | | | |
|---|---|---|---|
| 8,225,156 B1* | 7/2012 | Tabatabaei et al. | 714/727 |
| 8,286,046 B2* | 10/2012 | Ong | 714/738 |
| 8,310,265 B2* | 11/2012 | Zjajo et al. | 324/762.01 |
| 8,368,383 B2* | 2/2013 | Fefer et al. | 324/76.77 |
| 2002/0049941 A1* | 4/2002 | Lunde et al. | 714/724 |
| 2002/0073370 A1* | 6/2002 | Akram | 714/724 |
| 2002/0190707 A1* | 12/2002 | Farnworth et al. | 324/158.1 |
| 2003/0005381 A1* | 1/2003 | Bristow et al. | 714/738 |
| 2003/0046622 A1* | 3/2003 | Whetsel | 714/724 |
| 2003/0177425 A1* | 9/2003 | Okin | 714/724 |
| 2003/0191997 A1* | 10/2003 | Farnworth et al. | 714/724 |
| 2004/0003328 A1* | 1/2004 | Viens et al. | 714/724 |
| 2004/0254756 A1* | 12/2004 | Strittmatter | 702/117 |
| 2006/0020412 A1 | 1/2006 | Bruensteiner | |
| 2006/0132165 A1* | 6/2006 | Walker et al. | 324/765 |
| 2006/0152236 A1 | 7/2006 | Kim | |
| 2006/0174173 A1 | 8/2006 | Chen | |
| 2007/0013359 A1 | 1/2007 | Hatagami | |
| 2007/0113123 A1* | 5/2007 | Crouch et al. | 714/724 |
| 2007/0113126 A1* | 5/2007 | Ong | 714/724 |
| 2007/0208970 A1* | 9/2007 | Marinissen et al. | 714/724 |
| 2007/0260954 A1* | 11/2007 | Wong | 714/733 |
| 2008/0010576 A1 | 1/2008 | Urabe et al. | |
| 2008/0018356 A1* | 1/2008 | Anand et al. | 324/769 |
| 2008/0052574 A1* | 2/2008 | Smith et al. | 714/724 |
| 2008/0052584 A1* | 2/2008 | Doi | 714/736 |
| 2008/0061811 A1* | 3/2008 | Ong | 324/763 |
| 2008/0231310 A1* | 9/2008 | Vijayaraghavan et al. | 324/765 |
| 2009/0027076 A1* | 1/2009 | Farnworth et al. | 324/763 |
| 2009/0051380 A1* | 2/2009 | Chladek et al. | 324/754 |
| 2009/0077438 A1* | 3/2009 | Schuttert et al. | 714/727 |
| 2009/0153158 A1* | 6/2009 | Dunn et al. | 324/750 |
| 2010/0001755 A1* | 1/2010 | Weizman et al. | 324/765 |
| 2010/0011263 A1* | 1/2010 | Whetsel | 714/727 |
| 2010/0052724 A1* | 3/2010 | Mizuno | 324/765 |
| 2010/0100786 A1* | 4/2010 | Dixon et al. | 714/738 |
| 2010/0127729 A1* | 5/2010 | Zjajo | 324/763 |
| 2010/0225346 A1* | 9/2010 | Fefer et al. | 324/765 |
| 2010/0313087 A1* | 12/2010 | Whetsel | 714/724 |
| 2011/0066419 A1* | 3/2011 | Chiou | 703/14 |

* cited by examiner

INTEGRATED CIRCUIT DIE, AN INTEGRATED CIRCUIT PACKAGE AND A METHOD FOR CONNECTING AN INTEGRATED CIRCUIT DIE TO AN EXTERNAL DEVICE

FIELD OF THE INVENTION

This invention relates to an integrated circuit die, to an integrated circuit package and to a method for connecting an integrated circuit die to an external device.

BACKGROUND OF THE INVENTION

Testing of output drivers of integrated circuit is known. The known testing methods use external dedicated test equipment which individually tests each output port present on the integrated circuit. However, such testing is time consuming and requires expensive equipment.

Furthermore, a die is typically packaged e.g. using wirebonds, and mounted on a board. Its output ports are connected to external devices via transmission lines, formed by signal traces on a package and a printed circuit board. However, the presence of transmission lines connected to the output ports results in loss of the signal integrity due to inaccurate impedance matching. Thus for the sake of proper impedance matching between the integrated circuit output driver and conjugated transmission line the knowing of ration between the mentioned driver and the transmission line impedances is required.

United States Patent Application US2006/0020412 discloses a system to which a data signal which represents a known binary series is presented. The system includes a comparator which compares the data signal with a threshold level and outputs a high voltage or a low voltage depending on whether the level of the data signal is above or below the threshold level. A binary sampler samples the output signal from the comparator. The sampled signal is compared by an error compare circuit to determine whether the sample signal differs from the value defined by the known binary series. The amount of errors determined by the error compare circuit is counted by an error counter and the ratio of error counts verses the number of sample cycles defines the bit error rate (BER). By observing the variation in the BER as a function of threshold level and sampling phase, analog characteristics of the data signal are determined, such as the time when the data signal transitions from binary zero to a binary one.

However, this prior art system only allows a quality estimation of the communication channel (good or bad) based on BER measurements, without real impedance measurement.

SUMMARY OF THE INVENTION

The present invention provides an integrated circuit die, an integrated circuit package and a method for connecting an integrated circuit die to an external device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the embodiments may be, for the most parts, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 1:
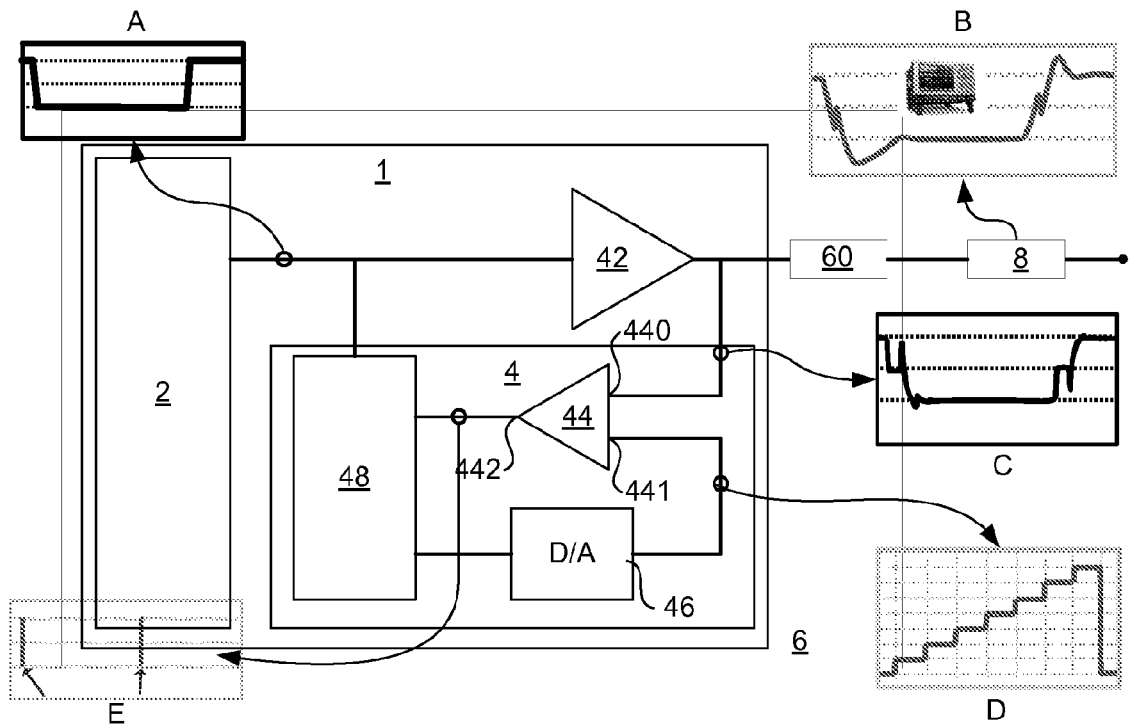
FIG. 1 schematically shows a block diagram of an example of an embodiment of an integrated circuit package.

Referring to the example of FIG. 1, an integrated circuit die 1 is shown. The die 1 is provided with an electronic circuit 2. One or more output ports 42 are provided on the die (in the example only a single port is shown for sake of simplicity however two or more output ports 42 may be present on the die 1). Via the output port signals may be outputted from the die to an external device 8, external from the die 1. In the shown example, an impedance 60 is shown which connects the output port 42 and the external impedance 8. The impedance 60 may for example represent a parasitic impedance formed by components, such as bondwires or pins, of a package 6 which contains the die 1 and via which the die 1 is connectable to the outside of the package 6. As shown, the output port 42 may be connected to the electronic circuit 2 and receive, e.g. digital, signals to be outputted from the electronic circuit 2. As shown, in addition to the package internal impedance 60, components outside the package 6, such as transmission lines on a board on which the die 1 is mounted may form an external impedance 8. For example, the package 6 may be mounted on a board which includes one or more signal paths, e.g. formed by signal traces and solder connections, connected to the output port, for propagating the outputted signal to devices or components outside the package.

As shown, the die 1 further may be provided with an on-die sampling oscilloscope circuit 4. The on-die sampling oscilloscope circuit 4 may be connected to the output port 42 and may be arranged to measure the waveform of the signals outputted by the output port 42, as will be explained in more detail below. From the waveform, a large variety of information about the outputted signal and/or the output driver interaction with the load may be obtained, such as the matching in impedance between the output port 42 and the off-die components (e.g. the impedance 60 or the external impedance 8) connected to the output port 42, the load connected to the external impedance 8 or other parameters. Furthermore, the on-die sampling oscilloscope circuit 4 allows a simple and reliable testing of the electronic circuit both before and after packaging the die and/or mounting the packaged die on a board.

Figure 2:
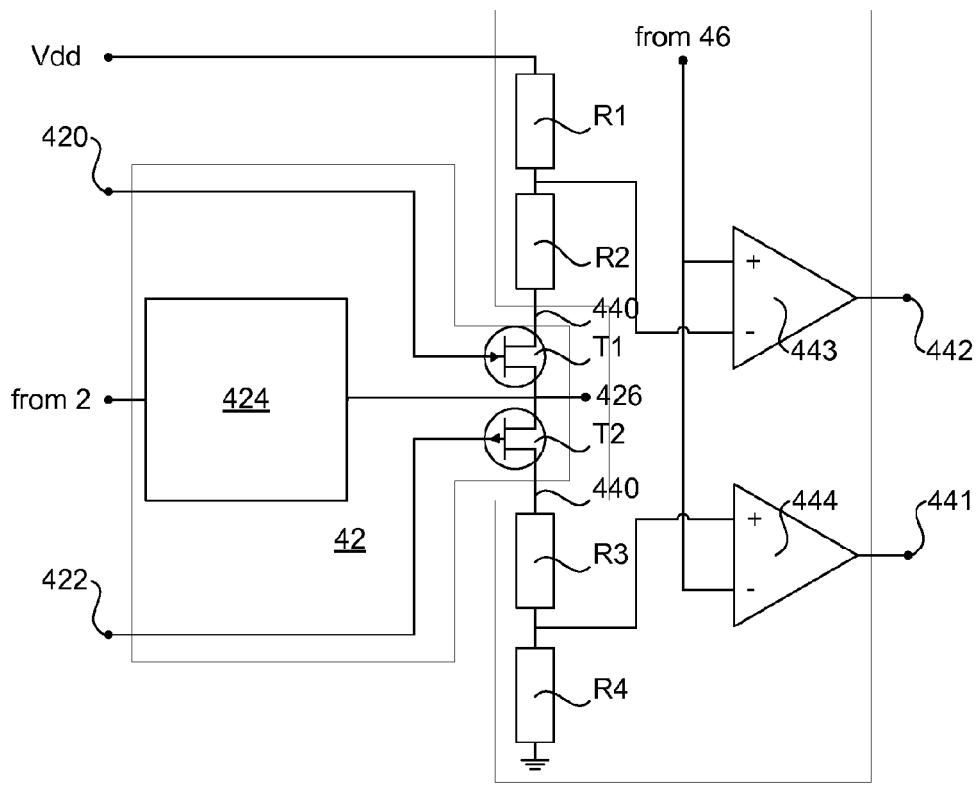
FIG. 2 schematically shows a circuit diagram of an example of an embodiment of an output port.

The output driver 42 may be implemented in any manner suitable for the specific implementation. Referring to FIG. 2, for example, the output port 42 may include an output driver 424 and an output contact 426. The output driver 424 may be connected to the electronic circuit 2 and may generate (as illustrated with graph C in FIG. 1) a high signal or a low signal in response to a logic signal received from the electronic circuit (as illustrated with graph A in FIG. 1). A node 426 forming the output contact 426 is connected to the output driver 424. The node 426 is connectable to the external impedance 8, to obtain a flow path for the high signal or a low signal and thus to transfer the high signal or low signal to components external to the package 6. In the example of FIG. 1, the actual signal at the receiving side of the external impedance 8 is illustrated with graph B. This signal may for example include the signal transmitted by the output driver 42 as well as components caused by the reflection of that signal by a device connected to the receiving side (far end) of the external impedance 8.

In the shown example, an analogue multiplexor, formed by a pair of transistors T1 and T2 of FIG. 2, is present which connects the node 426, at which in operation the signal of interest is present, to the on-die sampling oscilloscope circuit 4, in this example indirectly via voltage dividers, as is explained below in more detail. In the example of FIG. 2, the transistors T1, T2 connect the output contact 426 to a supply voltage Vdd and to ground, respectively. In this example, a transistor T1 is connected to the voltage supply Vdd via a series connection of resistors R1, R2 while the other transistor T2 is connected to ground via a series connection of resistors R3, R4. The transistors T1, T2 are connected with a control terminal, in this example their gates, to respective control contacts 420, 422 via which the path from the voltage supply Vdd to the output contact 426 and/or the path from the output contact 426 to ground can be enabled or disabled. Thus, by presenting a suitable control signal to the control contact 420, 422, the driver 42 can be selected as input for the on-die sampling oscilloscope circuit 4 For example, the integrated circuit die 1 may include multiple output drivers 42 which are connected to the same on-die sampling oscilloscope circuit 4, Accordingly, via the analogue multiplexor, formed by transistors T1 and T2 of FIG. 2, a desired output driver 42 may be selected as input for the sampling scope circuit 4.

Figure 3:
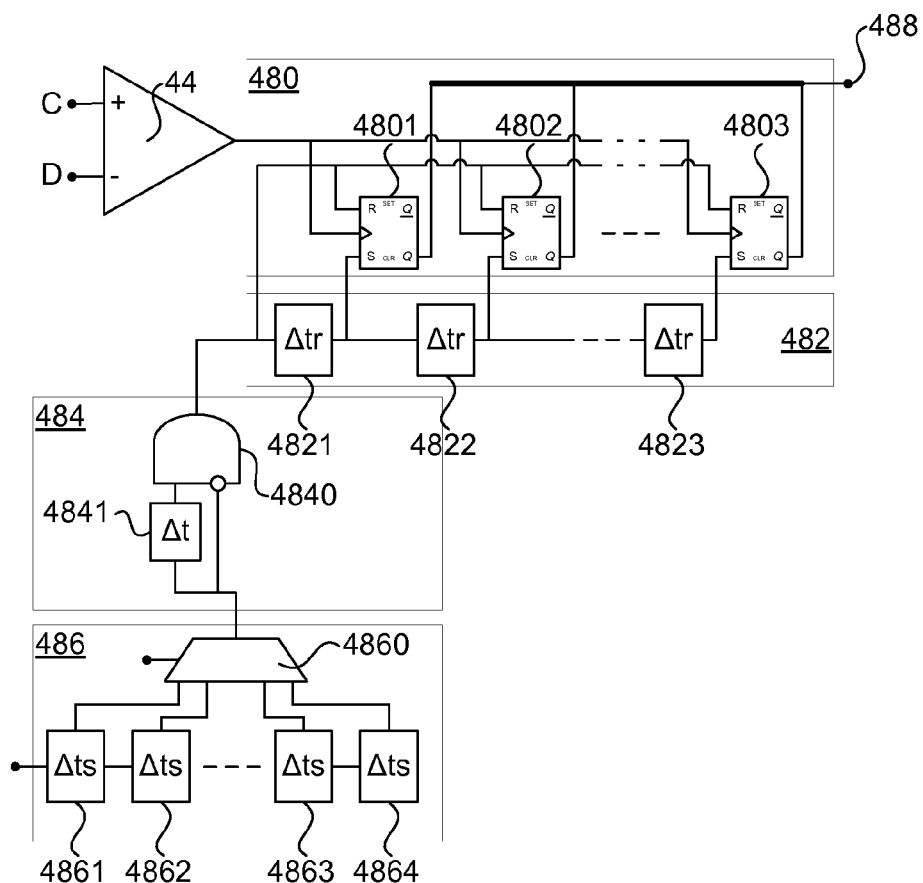
FIG. 3 schematically shows a block diagram of an example of an embodiment of an on-die sampling oscilloscope circuit, suitable to be connected to the example of FIG. 2.

The on-die sampling oscilloscope circuit 4 may be implemented in any manner suitable for the specific implementation. For instance, the example shown in FIGS. 1-3 use equivalent-time sampling, however alternatively the oscilloscope circuit 4 may use real-time sampling to determine the waveform. Referring to FIGS. 1-3, the on-die sampling oscilloscope circuit 4 may for example be connected to node between the output driver 424 and the output contact 426. However, the on-die sampling oscilloscope circuit 4 may alternatively be connected to another node suitable to measure the waveform of a signal of interest.

Referring to FIG. 2, the output driver 424 may provide a high signal or a low signal to the output contact 426. The voltages at the node between the resistors R1, R2 and the node between the resistors R3, R4 are attenuated voltages, related to the voltage at the output contact 426. As shown, those nodes may be connected to the on-die sampling oscilloscope circuit 4, thus allowing to determine the voltage at the output contact 426. The on-die sampling oscilloscope circuit 4 may measure signals which amplitude exceeds the on-die sampling oscilloscope circuit 4 and the output driver 42 supply and ground voltages (overshoot and undershoot). The voltage dividers formed by the pairs of resistors in series R1, R2 resp. R3, R4 provide the proper voltage range to the on-die sampling oscilloscope circuit 4.

In the example of FIG. 1, the on-die sampling oscilloscope circuit 4 includes a comparator 44 which is indirectly connected with a signal input 440 to the node 426. The comparator 44 is connected with a reference input 441 to a source, in this example a Digital to Analogue (D/A) converter 46, of a reference signal which allows scanning of the signal level, as is explained below in more detail The comparator 44 has a comparator output 442 at which a first logical signal is outputted when the level of the outputted signal is the same as the level of the reference signal level and at which a second logical signal, opposite to the first logical signal, is outputted when the outputted signal has a signal level below or above the reference signal level, as illustrated in FIG. 1 with graph E, Thus, the moment in time the level of the output signal 440 crosses the level of the reference signal 441 may be determined. The comparison of the output signal 440 with the reference signal 441 may be repeated over multiple cycles of the output signal 440 with the same level of the reference signal 441, until a result sufficiently reliable for the specific implementation is obtained.

By sampling multiple cycles of the output signal, each with different levels of the reference signal 441, the waveform of the output signal 440 may be determined. For instance, in the example of FIG. 2, after sampling the output signal over sufficient cycles thereof with the reference signal 441 at a first level, the D/A converter 46 provides a next level of the reference signal 441. After scanning of the output signal 440 over the whole range of the levels of the reference signal 441, the waveform of the output signal 440 may be obtained.

The comparator 44 may be implemented in any manner suitable for the specific implementation. Referring to the example of FIG. 2, for instance, the comparator 44 may include multiple comparator sections 443, 444. As shown, each section 443, 444 may be connected to the reference signal input 441 and receive the reference signal, e.g. from the D/A converter 46 in FIG. 2. The comparator sections 443, 444 may for example receive a signal with a signal level coupled to the level of the signal to be sampled, i.e. the output signal of the output port 42. For instance, in FIG. 2, a first section 443 is connected to the node between resistors R1, R2 and a second section 444 is connected to the node between resistors R3, R4. Thus, the first section 443 compares the signal 426 with a level of lower half of range, comprising descent below the ground voltage (undershoot), whereas the second section 444 compares the signal 426 with a level of upper half of range, comprising climbing above the supply voltage (overshoot), Referring back to the example of FIG. 1, the comparator output 442 may, as shown, be connected to a test unit 48. The test unit 48 may for example be a logic unit which generates a digital signal indicating the desired level for the reference signal 441. For instance, in the example, the D/A converter 46 receives a digital signal from a test unit 48 which represents the signal level and outputs a reference voltage which corresponds to the level represented by the digital signal. As shown, the reference signal level may be varied from a minimum level to a maximum level in cycles, for example as a step-function which increases step-wise and at the end of measurement cycle is reset to a base level. Each step of the step function may for example have a duration of at least a cycle of the output signal 440. The increment per step as well as the minimum level and a maximum level may be set depending on the requirements of the specific implementation The test unit 48 may be provided on the die and be able to perform one or more test functions on the integrated circuit. The test unit 48 may for example include logic for extracting one or more parameter from the captured waveform. The test unit 48 may for example compare the captured waveform with one or more test criteria to obtain information e.g. about the outputted signal, the die or the connection between the die and the external impedance 8.

The test unit 48 may for example extract parameters such as the driver output impedance, the signal level of the outputted signal, the impedance of an external load connected to the output port, the length of an external transmission line connected to the output port or the load of the external transmission line. For example, the information about matching between the driver and the conjugated transmission line impedances may be obtained by measuring the voltage level of the flat fragment of the captured signal, corresponding to forward and backward propagation of the signal in the mentioned transmission line.

The test unit 48 may be implemented in any manner suitable for the specific implementation Referring to FIG. 3, for example, the test unit 48 (FIG. 1) may include a pulse former 484 an offset delay generation unit (time-slot controller 486) and delay line 482. The time-slot controller 486) and delay line 482 provide a coarse and fine resolution scanning respectively.

Referring to FIG. 3, the on-die test unit 48 may further include a latch array 480. In this example, the latch array 480 is connected with a data input to the comparator 44 and has a data output bus 488. The latch array 480 includes a series of latches with asynchronous RESET (R) and synchronous (with the CLOCK input) SET (S) inputs 4801-4803 that are connected with their clock-input to the comparator output 442.

The Q-outputs of the latches 4801-4803 are connected to the data output bus 488 whereas their R-inputs are connected to pulse former 484 to receive a short synchronization pulse. The S-inputs are connected to respective nodes of a delay line 482 which receives and propagates the short latch array synchronization pulse. More in particular, as shown, each of the latches 4801-4803 is connected with its S-input to a different node between delay elements 4821-4823 of the delay line 482. Thus, each of the latches receives at the S-input the synchronization pulse inputted at the input of the delay line at a different point in time, e.g. latch 4801 will receive this signal delayed by $\Delta tr$, latch 4802 this signal delayed by $2*\Delta tr$, etc., while the signal is received at the S-input with a further delay, e.g. latch 4801 will receive this signal at the S-input delayed with $2*\Delta tr$, latch 4802 this signal delayed with $3*\Delta tr$, etc. In this example, the delays of the delay elements 4821-4823 are supposed to be the same for ease of understanding. However, the delays may alternatively be different for at least some of the delay elements. The delays may have any value suitable for the specific implementation. It has been found that a delay $\Delta tr$ in the range of about 0.02 times the transition period (rising/falling time) of the output signal gives good results. Although other values could be used as well.

As explained above, when the output signal 440 crosses the reference signal 441 the comparator 44 logic output will cause the Q-output of the latch that receives the short synchronization pulse at that point in time to be asserted, whereas the other latches will keep their outputs negated. Thus. the arrangement of a digital delay line combined by delay elements 4821-4823 and the latches 4801-4803 allows determine the point in time when the output signal 440 crosses the reference signal 441.

As mentioned above, at the input of the delay line 482 (fine time scaling) a pulsed signal may be received from the pulse former. As shown, the on-die sampling oscilloscope circuit may include a time-slot controller 486 and a pulse former 484. The time-slot controller 486 may control the period of time between beginning of the measurement (sought toggling of the output port 42 input signal) and resetting the latches 4801-4803 i.e. delay offset setting or coarse time scale scanning. The pulse former 484 forms a short pulse, which leading edge is synchronized to the beginning of each time slot. In the shown example, the time-slot controller 486 includes a delay line with delay elements 4861-4864 and a multiplexer 4860. The multiplexer 4860 is connected with its inputs to the nodes between the delay elements. Accordingly, by selecting a respective input a suitable delay (delay offset) can be selected and hence a suitable coarse delay can be set. For example, the total delay of the fine delay line 482 may be at least the same as the delay of each of the delay elements 4861-4864.

The pulse former 484 includes a delay element 4841 and an AND gate 4840 of which one input is connected to the delay element 4841 to receive the multiplexer output delayed and another input is an inverting input connected to the multiplexer to receive the multiplexer output without delay. As known for those skilled in the art, the pulse former is a classical digital differentiating circuit, which generates short pulse synchronized with the rising edge of an input signal and with the width equal to the propagation delay of a delay element.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections. Also, in the example the on-die sampling oscilloscope circuit is shown connected to a single output port. However, it is alternatively possible that the on-die sampling oscilloscope circuit 4 is connected to a plurality of output ports. For example, integrated circuit die 1 may include multiple output drivers 42. Each driver may be tested or characterized by its own sampling oscilloscope circuit 4. As well, one sampling oscilloscope circuit 4 may take care of multiple output drivers 42.

Furthermore, the semiconductor substrate described herein can be any semiconductor material or combinations of materials, such as gallium arsenide, silicon germanium, silicon-on-insulator (SOI), silicon, monocrystalline silicon, the like, and combinations of the above.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The connections as discussed herein may be illustrated or described in reference to being a single connections, a plurality of connections, unidirectional co connections nductors, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit die comprising:
    an electronic circuit;
    at least one output port for outputting signals from the die to an external component, external from the die, said output port being connected to the electronic circuit;
    said die further being provided with an on-die sampling oscilloscope circuit connected to said output port, for measuring a waveform of said outputted signals.

2. An integrated circuit die as claimed in claim 1, wherein output port includes:
    an output driver connected to said electronic circuit, for generating a high signal or a low signal in response to a logic signal received from the electronic circuit; and
    an output contact connected to said output driver, and connectable to said external component, for transferring said high signal or low signal to said external device.

3. An integrated circuit die as claimed in claim 2, wherein said on-die sampling oscilloscope circuit is connected to a node between said output driver and said output contact.

4. An integrated circuit die as claimed in claim 1, wherein said on-die sampling oscilloscope circuit includes:
    a comparator connected with a first comparator input to said output port via attenuator and with a second comparator input to a source of a reference signal with a reference signal level which changes over time, said comparator having a comparator output at which a high logical signal is outputted when said outputted signal has a signal level corresponding to said reference signal level and at which a low logical signal is outputted when said outputted signal has a signal level not corresponding to said reference signal level.

5. An integrated circuit die as claimed in claim 1, wherein said source provides a reference signal level which changes stepwise, and wherein a step of said reference signal level has a duration of at least a period of the outputted signals.

6. An integrated circuit die as claimed in claim 4, comprising a unit for determining a point in time said outputted signal has a signal level corresponding to said reference signal level.

7. An integrated circuit die as claimed in claim 1, wherein said on-die sampling oscilloscope circuit 4 has a maximum measuring level which exceeds a power supply level of the on-die sampling oscilloscope circuit and an output driver and/or a minimum measuring level which is below a ground of the on-die sampling oscilloscope circuit and the output driver.

8. An integrated circuit die as claimed in claim 1, wherein said die is further provided with a test unit for performing one or more test functions, said test function comprising comparing said measured waveform with at least one test criterion.

9. An integrated circuit die as claimed in claim 8, wherein said test unit includes logic for extracting at least one parameter related to the die or an environment of the die from said measured waveform.

10. An integrated circuit die as claimed in claim 9, wherein said parameter includes one or more of the group consisting of: driver output impedance, signal level of said outputted signal, impedance of an external load connected to said output port, length of an external transmission line connected to said output port, load of said external transmission line.

11. An integrated circuit die as claimed in claim 1, comprising a board on which said die is mounted, said board comprising at least one signal path connected to said output port, for propagating said outputted signal to said external device.

12. An integrated circuit die as claimed in claim 1, wherein said on-die sampling oscilloscope circuit is connected to a plurality of output ports.

13. An integrated circuit package, comprising:
    an integrated circuit die as claimed in claim 1 and a package in which said integrated circuit die is packaged at least one pin connecting the output port to outside the package.

14. A method of connecting an integrated circuit die to an external device, said integrated circuit die including an electronic circuit, and at least one output port for outputting signals from the die to an external component, external from the die, said output port being connected to the electronic circuit, said die further being provided with an on-die sampling oscilloscope circuit connected to said output port, for measuring a waveform of said outputted signals, said method comprising:

measuring a waveform of signals outputted at said output port using said on-die sampling oscilloscope circuit.

15. An integrated circuit die as claimed in claim 2, wherein said on-die sampling oscilloscope circuit includes:

a comparator connected with a first comparator input to said output port via attenuator and with a second comparator input to a source of a reference signal with a reference signal level which changes over time, said comparator having a comparator output at which a high logical signal is outputted when said outputted signal has a signal level corresponding to said reference signal level and at which a low logical signal is outputted when said outputted signal has a signal level not corresponding to said reference signal level.

16. An integrated circuit die as claimed in claim 2, wherein said source provides a reference signal level which changes stepwise, and wherein a step of said reference signal level has a duration of at least a period of the outputted signals.

17. An integrated circuit die as claimed in claim 2, comprising a unit for determining a point in time said outputted signal has a signal level corresponding to said reference signal level.

18. An integrated circuit die as claimed in claim 3, comprising a unit for determining a point in time said outputted signal has a signal level corresponding to said reference signal level.

19. An integrated circuit die as claimed in claim 2, wherein said on-die sampling oscilloscope circuit 4 has a maximum measuring level which exceeds a power supply level of the on-die sampling oscilloscope circuit and an output driver and/or a minimum measuring level which is below a ground of the on-die sampling oscilloscope circuit and the output driver.

20. An integrated circuit die as claimed in claim 2, wherein said die is further provided with a test unit for performing one or more test functions, said test function comprising comparing said measured waveform with at least one test criterion.

* * * * *